US010151853B2

(12) United States Patent
Won et al.

(10) Patent No.: US 10,151,853 B2
(45) Date of Patent: Dec. 11, 2018

(54) APPARATUS FOR INSPECTING ROBOT HANDS

(71) Applicant: SAMSUNG ELECTRONICS CO., LTD., Suwon-si, Gyeonggi-do (KR)

(72) Inventors: Jungmin Won, Suwon-si (KR); Myoungho Jung, Suwon-si (KR); Sang-Ho Lee, Suwon-si (KR); Dongyun Song, Hwaseong-si (KR); Sungkyung Yun, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 118 days.

(21) Appl. No.: 15/228,390

(22) Filed: Aug. 4, 2016

(65) Prior Publication Data

US 2017/0052019 A1 Feb. 23, 2017

(30) Foreign Application Priority Data

Aug. 21, 2015 (KR) ........................ 10-2015-0118117

(51) Int. Cl.
*H01L 21/67* (2006.01)
*G01V 8/14* (2006.01)
(Continued)

(52) U.S. Cl.
CPC .................. *G01V 8/14* (2013.01); *G01V 8/20* (2013.01); *H01L 21/67259* (2013.01);
(Continued)

(58) Field of Classification Search
CPC ............................ G01V 8/20; H01L 21/67259
(Continued)

(56) References Cited

U.S. PATENT DOCUMENTS 5,350,899 A * 9/1994 Ishikawa ............... G01J 5/0003 219/121.43
7,666,118 B1 * 2/2010 Anthony ............ A63B 21/0724 482/104
(Continued)

FOREIGN PATENT DOCUMENTS

JP 11179692 7/1999
JP 2004079615 3/2004
(Continued)

*Primary Examiner* — Thanh Luu
(74) *Attorney, Agent, or Firm* — F. Chau & Associates, LLC

(57) ABSTRACT

An inspection apparatus includes a supporting substrate. A first sensor unit is provided on the supporting substrate, the first sensor unit comprising a first light-emitting device and a first light-receiving device which are spaced apart from each other and face each other. A second sensor unit is provided on the supporting substrate, the second sensor unit comprising a second light-emitting device and a second light-receiving device which are spaced apart from each other and face each other. The first and second light-emitting devices and the first and second light-receiving devices are disposed at a same distance from a top surface of the supporting substrate. The first and second sensor units are configured to detect whether a robot hand moves in a first direction perpendicular to the top surface of the supporting substrate.

14 Claims, 8 Drawing Sheets

(51) Int. Cl.
*H01L 21/677* (2006.01)
*G01V 8/20* (2006.01)

(52) U.S. Cl.
CPC .. *H01L 21/67265* (2013.01); *H01L 21/67781* (2013.01); *Y10S 901/47* (2013.01)

(58) Field of Classification Search
USPC .......................................................... 250/221
See application file for complete search history.

(56) References Cited

U.S. PATENT DOCUMENTS

| | | | |
|---|---|---|---|
| 8,029,224 | B2 | 10/2011 | Abe et al. |
| 8,444,368 | B2 | 5/2013 | Irie |

FOREIGN PATENT DOCUMENTS

| | | |
|---|---|---|
| KR | 100318256 | 12/2001 |
| KR | 1020040005311 | 1/2004 |
| KR | 1020040083706 | 10/2004 |
| KR | 1020050019553 | 3/2005 |
| KR | 1020060072372 | 6/2006 |
| KR | 1020060118894 | 11/2006 |
| KR | 1020060124440 | 12/2006 |
| KR | 1020070030568 | 3/2007 |
| KR | 1020130128846 | 11/2013 |

* cited by examiner

APPARATUS FOR INSPECTING ROBOT HANDS

CROSS-REFERENCE TO RELATED APPLICATION

This U.S. non-provisional patent application claims priority under 35 U.S.C. § 119 to Korean Patent Application No. 10-2015-0118117, filed on Aug. 21, 2015, in the Korean Intellectual Property Office, the disclosure of which is herein incorporated by reference in its entirety.

TECHNICAL FIELD

The inventive concept relates to an apparatus for inspecting a wafer transferring robot, and more particularly, to an apparatus for inspecting a wafer transferring robot hand.

DISCUSSION OF THE RELATED ART

A wafer transferring robot may have a robot hand for transferring a wafer. When wafers are transferred by the robot hand, vertical distances between the robot hands and leveling (e.g., being perpendicular to a plumb line) of the robot hands may need to be determined. For example, the robot hands may need to be leveled and uniformly spaced apart. The leveling of the robot hands and the vertical distances between the robot hands may be measured by bubble levels, automatic levels, and visually, using a meter stick. However, measuring the leveling of the robot hands and vertical distances between the robot hands using the bubble levels, automatic levels, or by visual inspection may be time-consuming. In addition, the leveling measurements and the vertical distances between the robot hands may be inaccurate.

SUMMARY

According to an exemplary embodiment of the inventive concept, an inspection apparatus includes a supporting substrate. A first sensor unit is provided on the supporting substrate, the first sensor unit comprising a first light-emitting device and a first light-receiving device which are spaced apart from each other and face each other. A second sensor unit is provided on the supporting substrate, the second sensor unit including a second light-emitting device and a second light-receiving device which are spaced apart from each other and face each other. The first and second light-emitting devices and the first and second light-receiving devices are disposed at a same distance from a top surface of the supporting substrate. The first and second sensor units are configured to detect whether a robot hand moves in a first direction perpendicular to the top surface of the supporting substrate.

In an exemplary embodiment of the inventive concept, the robot hand inspection apparatus is configured to allow the robot hand to pass through regions between the first light-emitting device and the first light-receiving device and between the second light-emitting device and the second light-receiving device.

In an exemplary embodiment of the inventive concept, the inspection apparatus further includes supporting rods disposed on the supporting substrate. The first and second light-emitting devices and the first and second light-receiving devices are spaced apart from the supporting substrate and are respectively supported by the supporting rods.

In an exemplary embodiment of the inventive concept, the first light-emitting device is disposed at a first height with respect to the supporting substrate in the first direction, and the first height is greater than a thickness of the robot hand.

In an exemplary embodiment of the inventive concept, the first and second sensor units are configured to detect two different points of the robot hand.

In an exemplary embodiment of the inventive concept, the first sensor unit is configured to detect whether a robot hand passes through a first imaginary line connecting the first light-emitting device and the first light-receiving device, and the second sensor unit is configured to detect whether the robot hand passes through a second imaginary line connecting the second light-emitting device and the second light-receiving device.

In an exemplary embodiment of the inventive concept, the robot hand inspection apparatus is configured to detect a plurality of robot hands.

In an exemplary embodiment of the inventive concept, the first and second sensor units, respectively, are configured to measure start and end times of detecting each of the robot hands.

In an exemplary embodiment of the inventive concept, the first and second sensor units, respectively, are configured to detect each of the robot hands at substantially the same time and to stop detecting each of the robot hands at substantially the same time when the robot hands are substantially parallel to the supporting substrate.

In an exemplary embodiment of the inventive concept, the inspection apparatus further includes a wireless transmitting part for transmitting data measured by the first and second sensor units to a management unit. The management unit is configured to obtain information on distances between each of the robot hands and inclination angles of each of the robot hands using the data and to display the information.

According to an exemplary embodiment of the inventive concept, an inspection apparatus includes a supporting substrate. A first reflection-type sensor is positioned apart from the supporting substrate in a first direction. A second reflection-type sensor is positioned apart from the supporting substrate in the first direction and spaced apart from the first reflection-type sensor in a second direction. The first and second reflection-type sensors are provided at a same height from a top surface of the supporting substrate. The inspection apparatus is configured to allow at least one robot hand to be loaded on the supporting substrate in the second direction toward the second reflection-type sensor.

In an exemplary embodiment of the inventive concept, the first and second reflection-type sensors are configured to detect whether the at least one robot hand moves in a direction perpendicular to the top surface of the supporting substrate.

In an exemplary embodiment of the inventive concept, the first and second reflection-type sensors, respectively, are configured to detect the at least one robot hand.

In an exemplary embodiment of the inventive concept, the first and second reflection-type sensors, respectively, are configured to detect the at least one robot hand at substantially the same time and to stop detecting the at least one robot hand at substantially the same time, when the at least one robot hand is substantially parallel to the supporting substrate.

In an exemplary embodiment of the inventive concept, the inspection apparatus further includes a wireless transmitting part for transmitting data measured by the first and second reflection-type sensors to a management unit, and further includes a plurality of robot hands. The management unit is configured to obtain information on distances between each of the plurality of robot hands and inclination angles of each of the plurality of robot hands using the data and to display the information.

According to an exemplary embodiment of the inventive concept, a system for inspecting a wafer transferring robot includes an inspection apparatus, a wafer transferring unit, and a management unit. The inspection apparatus includes a supporting substrate, a first light-emitting device disposed at a first distance from the supporting substrate in a first direction and configured to emit a first light in a second direction, wherein the first and second directions cross each other, a second light-emitting device disposed at the first distance from the supporting substrate in the first direction and configured to emit a second light in the second direction, wherein the second light-emitting device is spaced apart from the first light-emitting device in a third direction that is orthogonal the first and second directions, a first light-receiving device configured to detect the first light, a second light-receiving device configured to detect the second light, and a transmitting unit. The wafer transferring unit includes a first robot hand and a second robot hand spaced apart from the first robot hand in the first direction, wherein the first and second robot hands are disposed on the substrate, and a first control part configured to move the first and second robot hands in the first direction at a first speed, wherein the first and second robot hands are detected by the first and second light-receiving devices, respectively, when blocking the first and second lights from being detected by the first and second light-receiving devices, wherein the transmitting unit is configured to transmit times when the first and second robot hands were detected by the first and second light-receiving devices to a receiving part of the management unit. The management unit includes the receiving part configured to receive the transmitted times when the first and second robot hands were detected by the first and second light-receiving devices, and a second control part configured to determine a first angle of the first robot hand with respect to the substrate using the first speed and the received times when the first and second robot hands were detected by the first and second light-receiving devices.

In an exemplary embodiment of the inventive concept, the second control part is further configured to determine a first distance between the first and second robot hands in the first direction using the first speed and the received times when the first and second robot hands were detected by the first and second light-receiving devices.

In an exemplary embodiment of the inventive concept, the received times when the first and second robot hands were detected by the first and second light-receiving devices include a first time when the first robot hand was detected by the first light-receiving device and a second time when the second robot hand was detected by the second light-receiving device.

In an exemplary embodiment of the inventive concept, the angle of the first robot hand is determined using a first time in which the first light-receiving device detects a first portion of the first robot hand, a second time in which the second light-receiving device detects a second portion of the first robot hand, and the first speed.

In an exemplary embodiment of the inventive concept, the management unit further includes a storage device configured to store the first angle and the first distance, and a display device configured to display the first angle and the first distance.

BRIEF DESCRIPTION OF THE DRAWINGS

The above and other features of the inventive concept will become more clearly understood by describing in detail exemplary embodiments thereof in conjunction with the accompanying drawings, in which.

Figure 1:
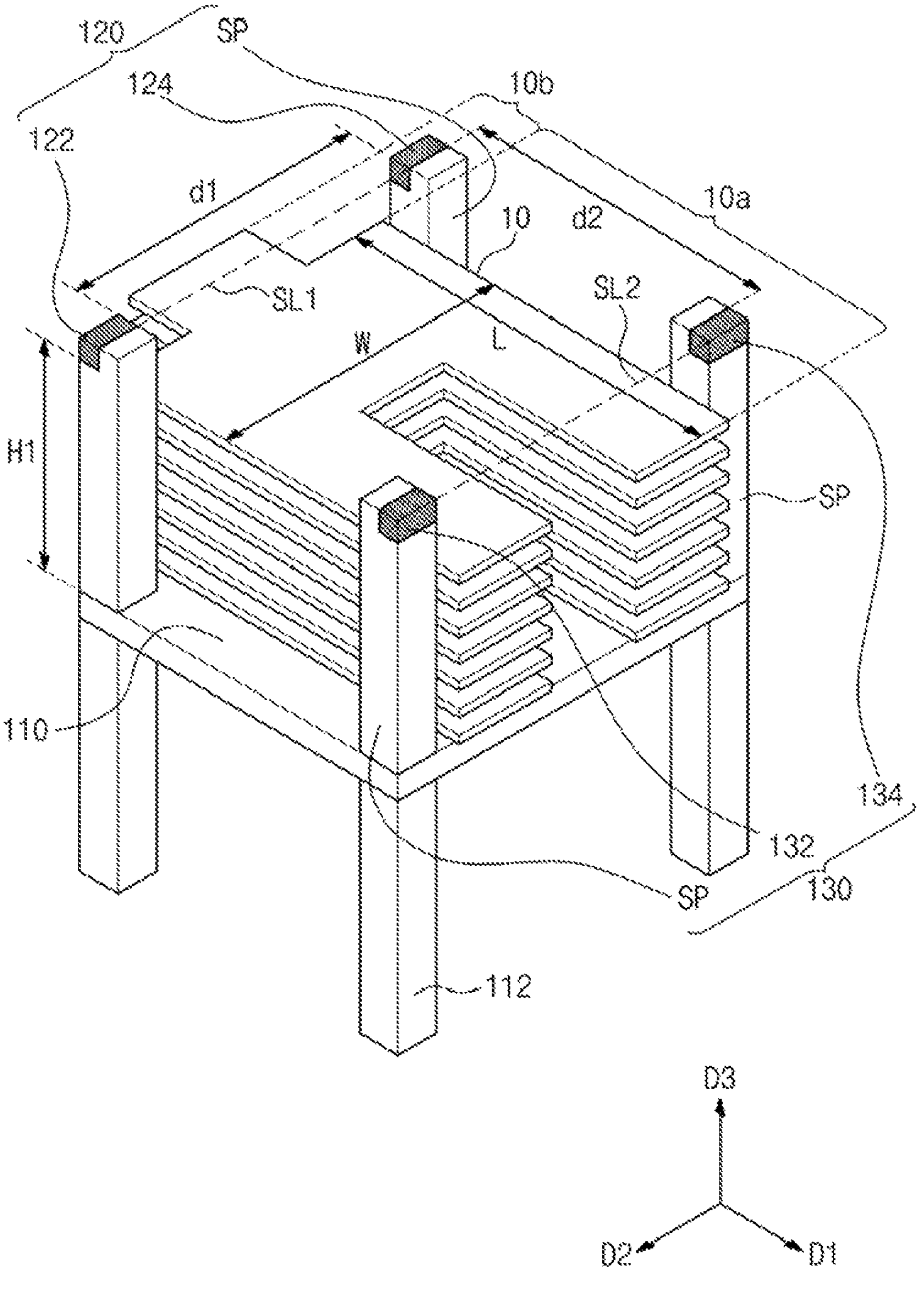
FIG. 1 is a perspective view illustrating a robot hand inspection apparatus, according to an exemplary embodiment of the inventive concept.

It should be noted that these figures are intended to illustrate the characteristics, structure and/or materials utilized in exemplary embodiments of the inventive concept. These drawings, however, might not be to scale and should not be interpreted as limiting the exemplary embodiments of the inventive concept thereto. For example, the relative thicknesses and positioning of molecules, layers, regions and/or structural elements may be reduced or exaggerated for clarity. Like reference numerals may refer to like elements throughout the specification.

DETAILED DESCRIPTION OF THE EMBODIMENTS

The inventive concept will now be described more fully with reference to the accompanying drawings, in which exemplary embodiments thereof are shown. Exemplary embodiments of the inventive concept may, however, be embodied in many different forms and should not be construed as being limited to the embodiments set forth herein. In the drawings, the thicknesses of layers and regions may be exaggerated for clarity.

As used herein the term "and/or" may include any and all combinations of one or more of the associated listed items.

As used herein, the singular forms "a," "an" and "the" are intended to include the plural forms as well, unless the context clearly indicates otherwise.

Unless otherwise defined, all terms (including technical and scientific terms) used herein have the same meaning as commonly understood by one of ordinary skill in the art. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 4:
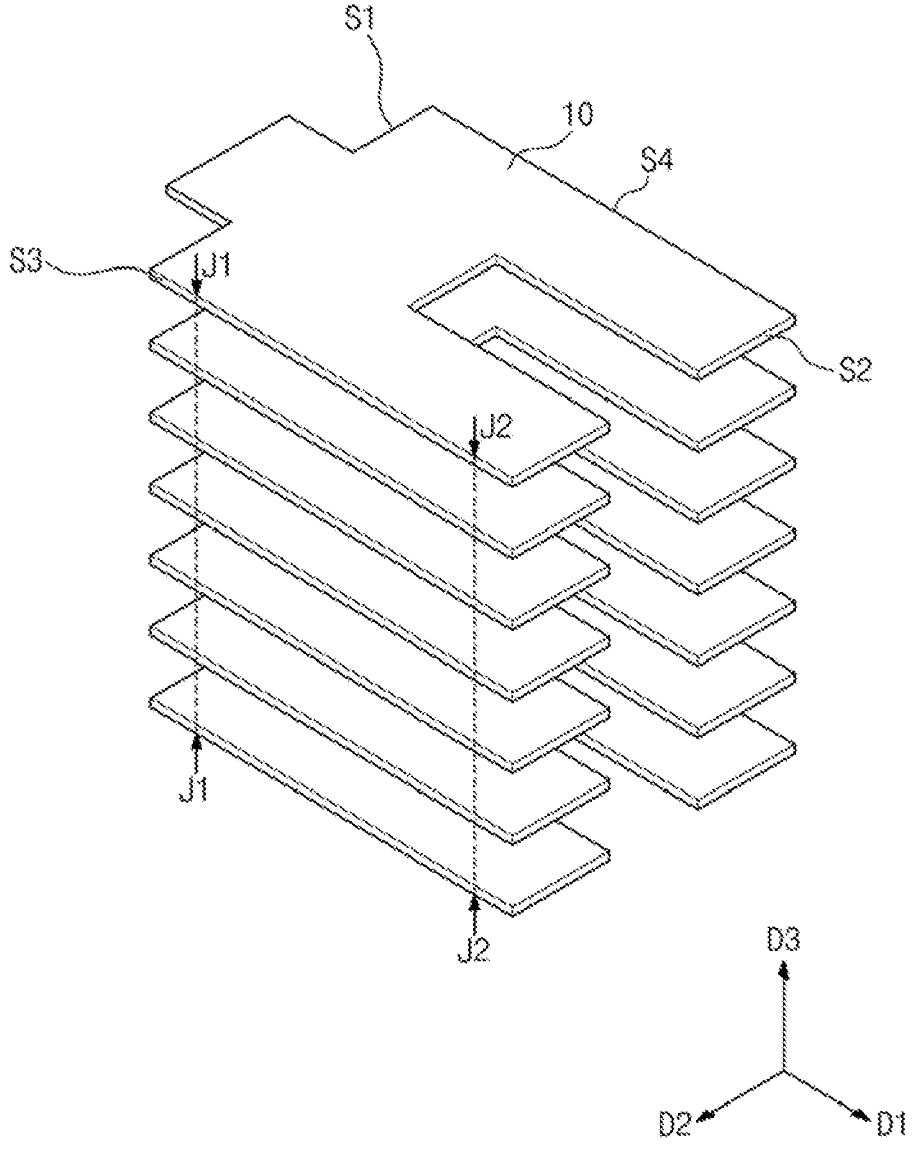
FIG. 4 is a perspective view illustrating a robot hand, according to an exemplary embodiment of the inventive concept.

FIG. 1 is a perspective view illustrating a robot hand inspection apparatus, according to an exemplary embodiment of the inventive concept. FIG. 4 is a perspective view illustrating a robot hand, according to an exemplary embodiment of the inventive concept. For brevity, a robot hand inspection apparatus and a robot hand, respectively, may be described with reference to FIGS. 1 and 4.

Referring to FIGS. 1 and 4, a wafer transferring robot may include a robot hand 10. The robot hand 10 may include a first portion 10*a* and a second portion 10*b*. In an exemplary embodiment of the inventive concept, the second portion 10*b* may be connected to a body of the wafer transferring robot. During a wafer transferring process, a wafer may be provided on the first portion 10*a*. The robot hand 10 may have at least four side surfaces (e.g., first to fourth side surfaces S1, S2, S3, and S4). The third side surface S3 may extend in a first direction D1 parallel to a top surface of a supporting substrate 110. The fourth side surface S4 may be opposite to the third side surface S3 and may extend in the first direction D1. The third and fourth side surfaces S3 and S4 may be connected to the first and second side surfaces S1 and S2. The first and second side surfaces S1 and S2 may extend in a second direction D2 which intersects the first direction D1 and is parallel to the top surface of the supporting substrate 110. The first side surface S1 may be connected to the wafer transferring robot and may be disposed on a direction opposite to the first direction D1 with respect to the second side surface S2. For example, the first and second side surfaces S1 and S2 may be opposite to each other.

Although seven robot hands 10 are exemplarily illustrated in FIG. 1, the number of the robot hands 10 may be varied. The robot hands 10 may be spaced apart from each other, in a third direction D3 that is orthogonal to the first and second directions D1 and D2. Each of the robot hands 10 may include the first portion 10*a* whose length and width are L and W, respectively. The length L and the width W are dimensions measured in the first and second directions D1 and D2, respectively.

Figure 2:
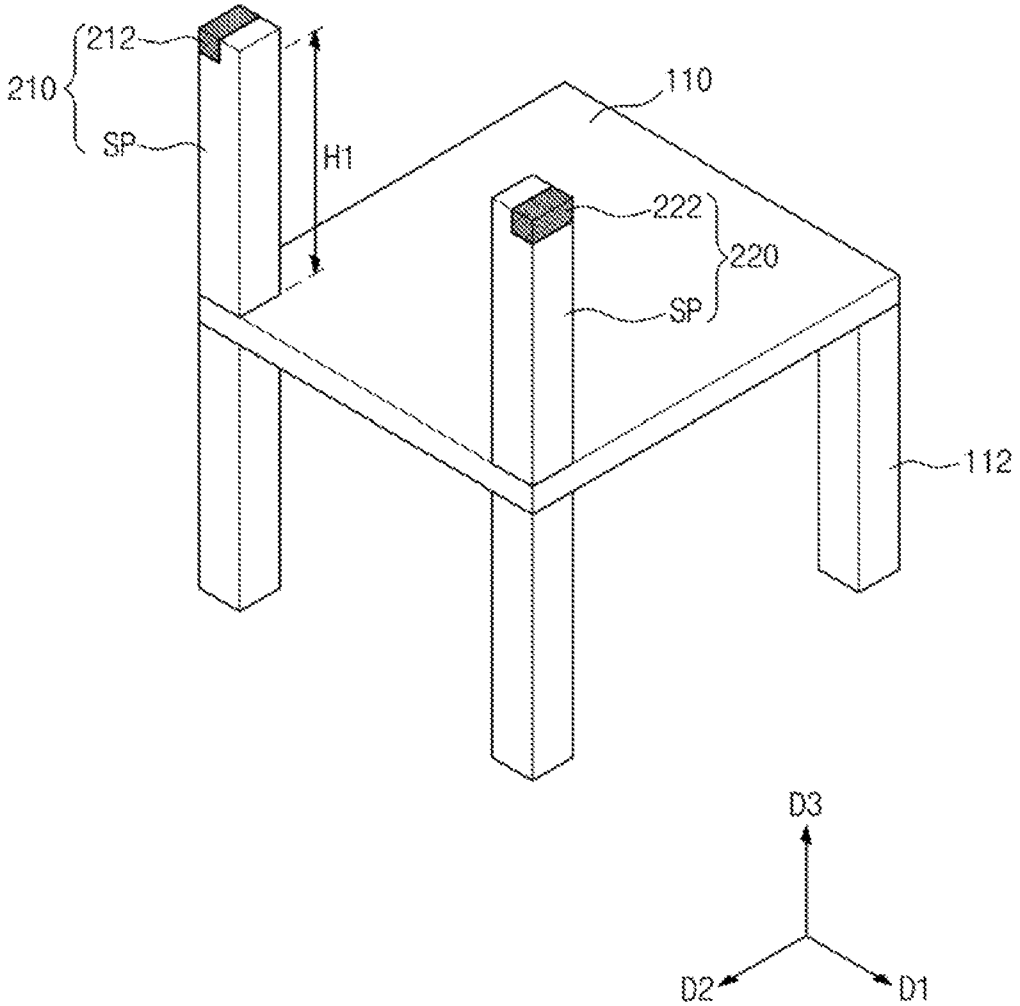
FIG. 2 is a perspective view illustrating an inspection apparatus for a wafer-transferring robot hand, according to an exemplary embodiment of the inventive concept.

The supporting substrate 110 may be provided below the robot hands 10 to support sensor units 120 and 130. The sensor unit 120 may be referred to as a first sensor unit 120. The sensor unit 130 may be referred to as a second sensor unit 130. The supporting substrate 110 may be supported by legs 112. The supporting substrate 110 may be provided in the form of a plate. When viewed in a plan view, the supporting substrate 110 may have a rectangular shape, as shown in FIG. 2, but exemplary embodiments of the inventive concept are not limited thereto.

The first sensor unit 120 may be provided on the supporting substrate 110. The first sensor unit 120 may be configured to collect data on start and end times of a sensing operation, when the sensing operation is performed on each of the robot hands 10. The first sensor unit 120 may include a first light-emitting device 122, a first light-receiving device 124, and supporting rods SP. The first light-emitting device 122 may be spaced apart from the top surface of the supporting substrate 110 by a first height H1 in the third direction D3. In an exemplary embodiment of the inventive concept, the first height H1 may be greater than a sum of thicknesses of the robot hands 10 and of distances between the robot hands 10. The thickness of the robot hands 10 may be measured along the third direction D3. For example, in an exemplary embodiment of the inventive concept, in the case where the number of the robot hands is seven, the first height H1 may be at least 120 mm. The first light-emitting device 122 may be configured to emit a first light. In an exemplary embodiment of the inventive concept, the first light may include a laser beam. A first sensing line SL1 shown in FIG. 1 may illustrate an example of a propagation path of the first light.

The first light-receiving device 124 may be provided on the supporting substrate 110 and may be spaced apart from the first light-emitting device 122 by a first distance d1 in the second direction D2. The first distance d1 may be longer than the width W of the first portion 10*a* of the robot hand 10. For example, the first distance d1 may be greater than about 135 mm. Due to the difference between the first distance d1 and the width W, the robot hand 10 may pass or move through a region between the first light-emitting device 122 and the first light-receiving device 124. The first distance d1 may be smaller than an effective sensing distance of a sensor in use. In an exemplary embodiment of the inventive concept, the first light-receiving device 124 may be provided at the same level as the first light-emitting device 122. For example, in an exemplary embodiment of the inventive concept, the first light-receiving device 124 and the first light-emitting device 122 are disposed at the first height H1 or at equal heights with respect to the supporting substrate 110. The first light-receiving device 124 may be configured to sense the first light to be emitted from the first light-emitting device 122. The first sensing line SL1 may be a line connecting the first light-emitting device 122 to the first light-receiving device 124. In the case where a robot hand 10 is located on the first sensing line SL1, the first light may not be detected by the first light-receiving device 124. A thickness of a robot hand 10 and a vertical distance between the robot hands 10 may be determined, based on whether or not the first light is detected by the first light-receiving device 124 and a time period during which the first light is detected by the first light-receiving device 124.

The supporting rods SP may be provided between the first light-emitting device 122 and the supporting substrate 110 and between the first light-receiving device 124 and the supporting substrate 110. A supporting rod SP may be provided on the supporting substrate 110 to support the first light-emitting device 122 or the first light-receiving device 124. As shown, the supporting rods SP may be provided in the form of a pillar with a rectangular section, but the inventive concept is not limited thereto. For example, each or at least one of the supporting rods SP may be a pillar with a circular or polygonal section.

The second sensor unit 130 may be provided on the supporting substrate 110. The second sensor unit 130 may be configured to collect data on start and end times of a sensing operation, when the sensing operation is performed on each of the robot hands 10. The second sensor unit 130 may include a second light-emitting device 132, a second light-receiving device 134, and supporting rods SP. The second light-emitting device 132 may be provided on the supporting substrate 110 and may be spaced apart from the top surface of the supporting substrate 110. In an exemplary embodiment of the inventive concept, the second light-emitting device 132 may be provided at a position spaced apart from the top surface of the supporting substrate 110 by the first height H1 in the third direction D3. The first height H1 may be substantially the same as that for the first light-emitting device 122 described above. The second light-emitting device 132 may be spaced apart from the first light-emitting device 122 by a second distance d2 in the first direction D1. In an exemplary embodiment of the inventive concept, the second distance d2 may be shorter than the length L of the first portion 10*a* of the robot hand 10. For example, in an exemplary embodiment of the inventive concept, the second distance d2 may be shorter than about 150 mm. The second light-emitting device 132 may be configured to emit a second light. In an exemplary embodiment of the inventive concept, the second light may include a laser beam. A second sensing line SL2 shown in FIG. 1 may illustrate an example of a propagation path of the second light.

The second light-receiving device 134 may be provided on the supporting substrate 110 and may be spaced apart from the second light-emitting device 132 by the first distance d1 in the second direction D2. The first distance d1 may be substantially the same as that for the first light-receiving device 124 described above. Accordingly, the robot hands 10 may pass or move through a region between the second light-emitting device 132 and the second light-receiving device 134. In other words, the inspection apparatus is configured to allow the robot hand to pass between the first light-emitting device 122 and the first light-receiving device 124 and between the second light-emitting device 132 and the second light-receiving device 134. The first distance d1 may be smaller than an effective sensing distance of a sensor in use. In an exemplary embodiment of the inventive concept, the second light-receiving device 134 may be provided at the same height or level as the second light-emitting device 132. In the case where a robot hand 10 is located on the second sensing line SL2, the second light may not be detected by the second light-receiving device 134. A thickness of a robot hand 10 and a vertical distance between the robot hands 10 may be determined, based on whether or not the second light is detected by the second light-receiving device 134. The thickness of a robot hand 10 and a vertical distance between two or more robot hands 10 may be determined using the velocity of the robot hands 10 in the third direction D3 and a time during which each of the robot hands 10 was detected by the first and second light-receiving devices 124 and 134, and a length of time during which each of the robot hands 10 was detected by the first and second light-receiving devices 124 and 134.

The supporting rods SP may be provided between the second light-emitting device 132 and the supporting substrate 110 and between the second light-receiving device 134 and the supporting substrate 110. The supporting rods SP may be configured to have substantially the same technical features as those between the first light-emitting device 122 and the supporting substrate 110 and between the first light-receiving device 124 and the supporting substrate 110.

According to an exemplary embodiment of the inventive concept, since two sensor units are provided, by moving the robot hands 10 in the third direction D3, the vertical distances between the robot hands 10 may be checked. In addition, whether the robot hands 10 are tilted, sloped, or form an angle with respect to the supporting substrate 110 may be determined using the two sensor units. In other words, the robot hands may be inspected without necessity of moving them in the first direction D1. However, technical features and aspects of the inventive concept are not limited to those disclosed above.

FIG. 2 is a perspective view illustrating an inspection apparatus for a wafer-transferring robot hand, according to an exemplary embodiment of the inventive concept. For brevity, elements previously described with reference to FIG. 1 may be referred to using similar or identical reference numerals.

Referring to FIG. 2, a first reflection sensor unit 210 including a first reflection sensor 212 and the supporting rod SP may be provided on the supporting substrate 110. The first reflection sensor 212 may be configured to emit sensing signals toward the robot hand (not shown) and detect the sensing signal reflected by the robot hand. For example, the first reflection sensor 212 may be configured to emit the sensing signals in a direction opposite to the second direction D2. When the robot hand passes across a propagation path of the sensing signal, the sensing signal may be reflected toward the first reflection sensor 212 by the robot hand. The sensing signal that is reflected may be sensed or detected by the first reflection sensor 212. The first reflection sensor 212 may be referred to as a first reflection-type sensor. In an exemplary embodiment of the inventive concept, a laser signal may be used as the sensing signal of the first reflection sensor 212. The first reflection sensor 212 may be spaced apart from the top surface of the supporting substrate 110 by the first height H1 in the third direction D3. The first height H1 may be substantially the same as that described with reference to FIG. 1. A supporting rod SP may be provided on the supporting substrate 110 to support the first reflection sensor 212.

A second reflection sensor unit 220 including a second reflection sensor 222 and a supporting rod SP may be provided on the supporting substrate 110. The second reflection sensor 222 may be configured to emit sensing signals toward the robot hands 10 and detect the sensing signal reflected by the robot hands 10. For example, the second reflection sensor 222 may be configured to emit the sensing signals in a direction opposite to the second direction D2. When a robot hand 10 passes across a propagation path of the sensing signal, the sensing signal may be reflected toward the second reflection sensor 222 by the robot hand 10. The reflected sensing signal may be sensed or detected by the second reflection sensor 222. The second reflection sensor 222 may be referred to as a second reflection-type sensor. In an exemplary embodiment of the inventive concept, a laser signal may be used as the sensing signal of the second reflection sensor 222. The second reflection sensor 222 may be spaced apart from the top surface of the supporting substrate 110 by the first height H1 in the third direction D3. The first height H1 may be substantially the same as that described with reference to FIG. 1. A supporting rod SP may be provided on the supporting substrate 110 to support the second reflection sensor 222.

According to an exemplary embodiment of the inventive concept, since two sensor units are provided, by moving the robot hands 10 in the third direction D3, the vertical distances between the robot hands 10 may be checked. In addition, whether the robot hands 10 are tilted, sloped, or form an angle with respect to the supporting substrate 110 may be determined using the two sensor units. In other words, the robot hands may be inspected without necessity of moving them in the first direction D1. However, technical features and aspects of the inventive concept are not limited to those disclosed above.

Hereinafter, a method of operating a robot hand inspection apparatus according to exemplary embodiments of the inventive concept will be described.

Figure 3:
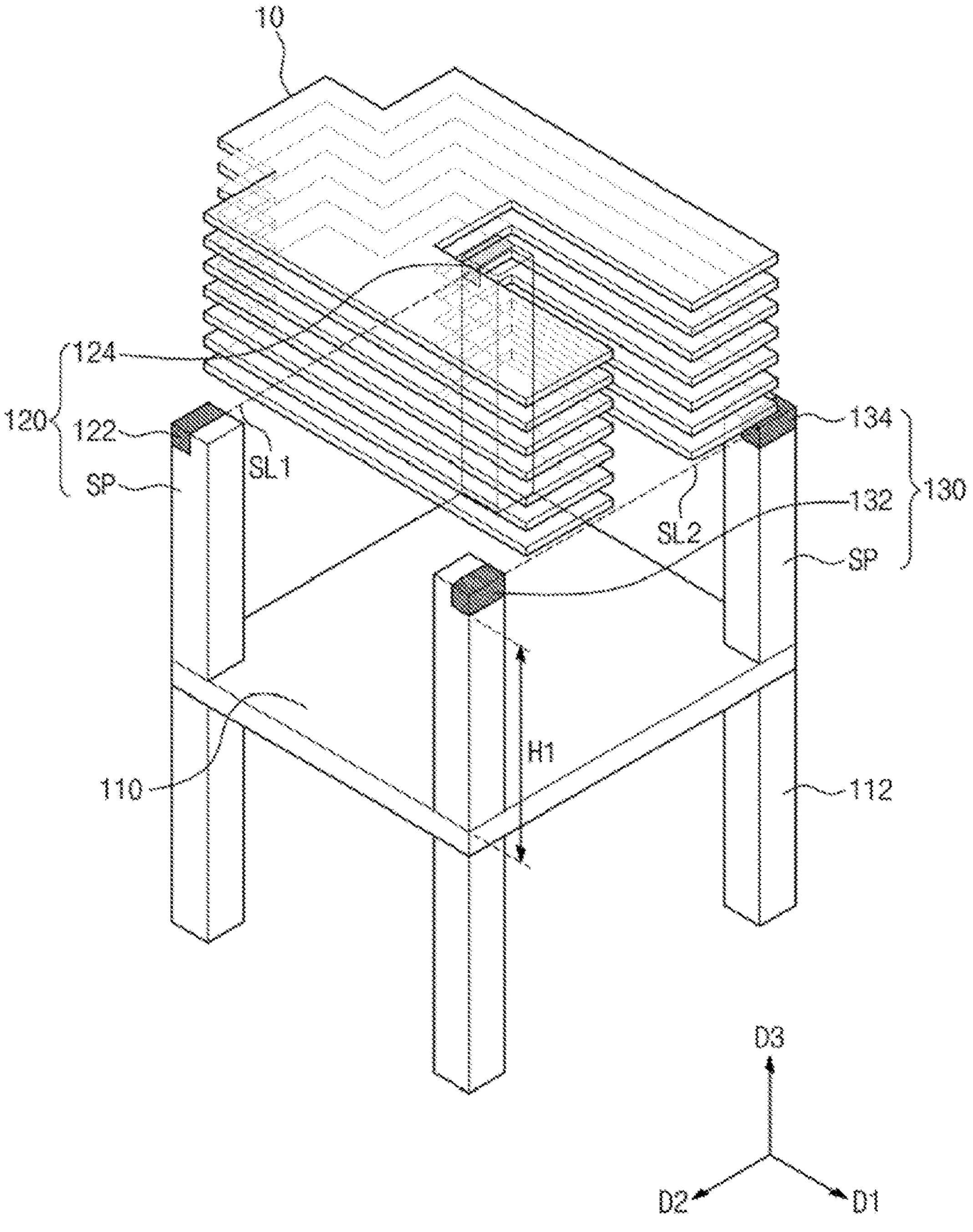
FIG. 3 is a perspective view illustrating a state of a robot hand inspection apparatus according to an exemplary embodiment of the inventive concept.

FIG. 3 is a perspective view illustrating a state of a robot hand inspection apparatus according to an exemplary embodiment of the inventive concept. For example, in FIG. 3, in an exemplary embodiment of the inventive concept, a robot hand sensing operation is performed once. For simplicity, the description that follows may refer to an example in which the sensor is a transmitting and receiving type sensor, but the inventive concept is not limited thereto. Also, the description that follows may refer to an example in which seven robot hands are provided, but the inventive concept is not limited thereto. To provide better understanding of exemplary embodiments of the inventive concept, the robot hands are illustrated as transparent objects in FIG. 3. For brevity, an element previously described with reference to FIGS. 1 and 2 may be referred to using a similar or identical reference numeral.

Referring to FIG. 1, the robot hands 10 may be disposed below the sensing lines SL1 and SL2, before the inspection of the robot hands 10. For example, the robot hands 10 may be disposed in such a way that a top surface of the uppermost robot hand 10 is positioned below the sensing lines SL1 and SL2. A bottom surface of the lowermost robot hand 10 may be spaced apart from the top surface of the supporting substrate 110. In an exemplary embodiment of the inventive concept, the bottom surface of the lowermost robot hand 10 may be spaced apart from the top surface of the supporting substrate 110 by a distance of about 10 mm.

Referring to FIGS. 1, 3, and 4, the robot hands 10 may move in the third direction D3 perpendicular to the top surface of the supporting substrate 110 and may be positioned at a higher level than the sensing lines SL1 and SL2. The movement of the robot hands 10 may be controlled by a control unit of a wafer transferring robot. For example, the control unit may be included in a body of the wafer transferring robot and may be used to control the movement, in the third direction D3, of the robot hands 10. The robot hands 10 may move with uniform speed in the third direction D3. Each sensing operation may be terminated when all of the robot hands 10 pass across the sensing lines SL1 and SL2. The first and second sensor units 120 and 130 may be configured to provide a time, taken to perform an operation of sensing the robot hands 10, as sensing data. The moving speed and the sensing data of the robot hands 10 may be used to determine whether the side surfaces S1, S2, S3, and S4 are positioned at the same level (e.g., height, with respect to the supporting substrate 110) and/or whether vertical distances in the third direction D3 between the robot hands 10 are the equal to each other.

Figure 5:
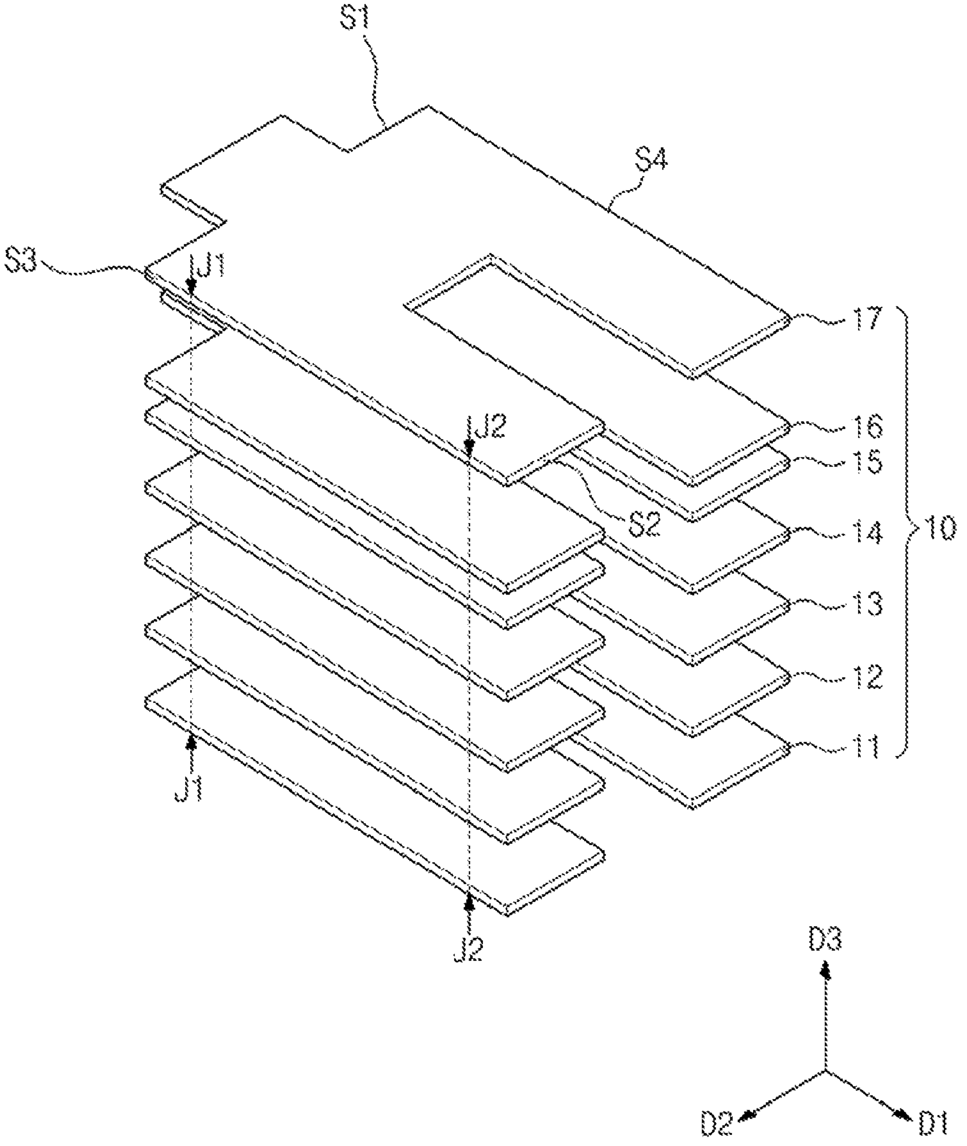
FIGS. 5 through 7 are perspective views illustrating a method of inspecting robot hands with height abnormality, according to exemplary embodiments of the inventive concept.
Figure 6:
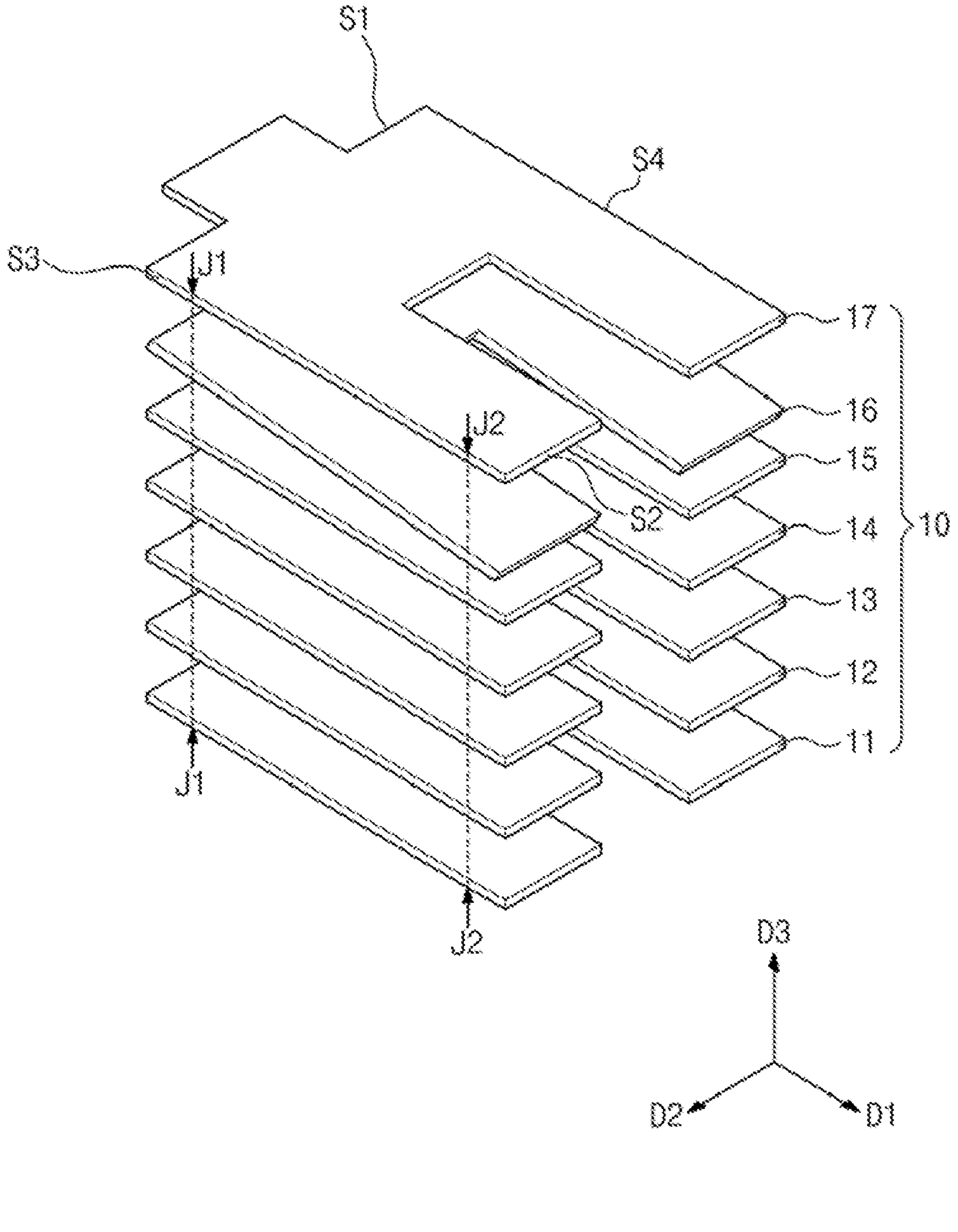
Figure 7:
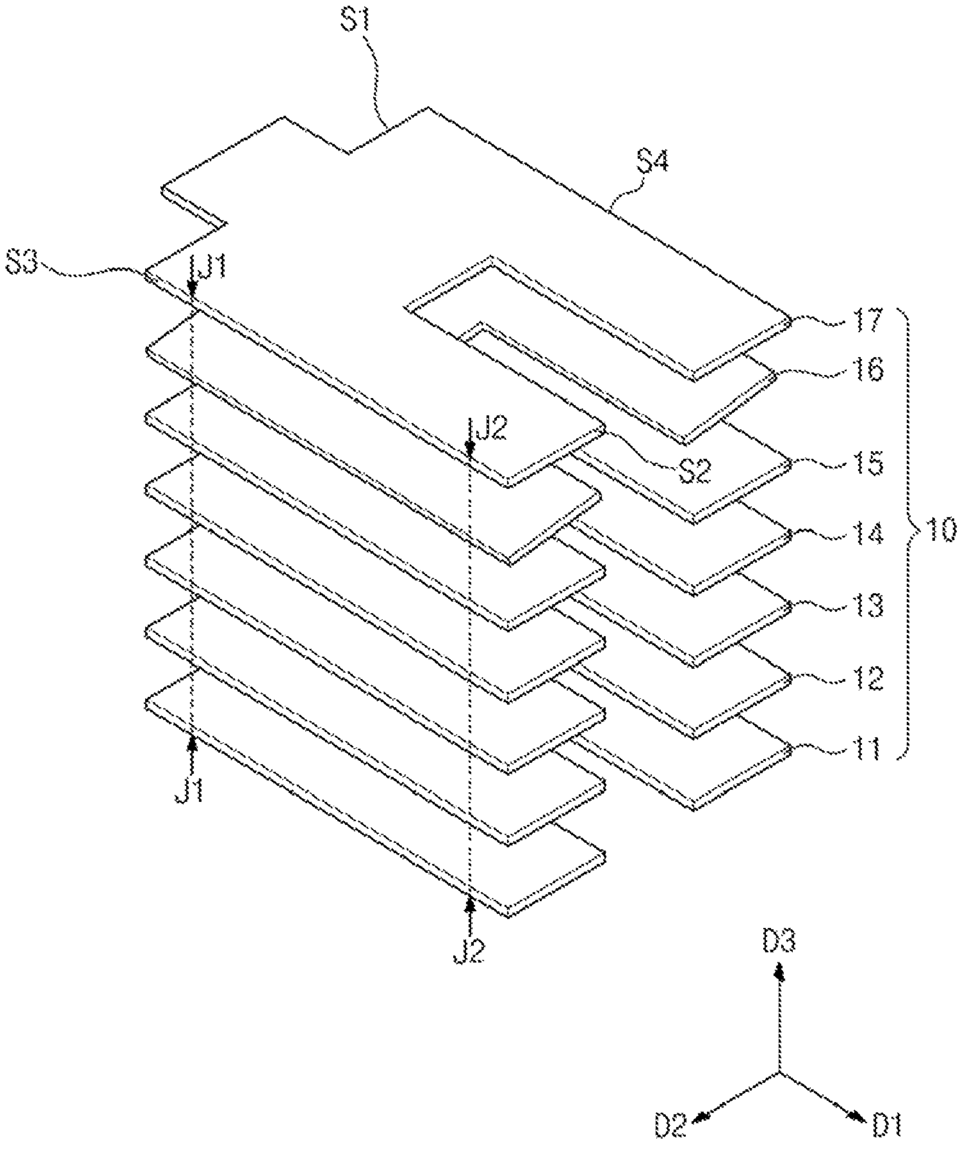

FIGS. 5 through 7 are perspective views illustrating a method of inspecting robot hands with height abnormality. For brevity, the supporting substrate and the sensor units are omitted from FIGS. 5 through 7, according to exemplary embodiments of the inventive concept.

An inspection method for robot hands will be described with reference to FIG. 4. Information on positions of the robot hands 10 may be measured along a first line J1 and a second line J2. The inspection or measurement process of the robot hands 10 may be performed along the first line J1 and the second line J2. For example, the first light-emitting device 122 may be configured in such a way that the propagation path of the first light intersects a point on the first line J1. The movement in the third direction D3 of the robot hands 10 may lead to a change in the presence or absence of the first light to be detected by the first sensor unit 120. Accordingly, the first sensor unit 120 may collect information associated with positions of the robot hands 10. The first sensor unit 120 may also be configured to collect information including a time (e.g., a start time) when a robot hand 10 was first detected by the first sensor unit 120, an amount of time during which the robot hand 10 continued to be detected by the first sensor unit 120 and a time (e.g., an end time) when the robot hand 10 stopped being detected by the first sensor unit 120. This may be done for all the robot hands 10. The second sensor unit 130 may collect information on positions of the robot hands 10 along the second line J2, in substantially the same manner as that of the first sensor unit 120. The second sensor unit 130 may also be configured to collect information including a time (e.g., a start time) when a robot hand 10 was first detected by the second sensor unit 130, an amount of time during which the robot hand 10 continued to be detected by the second sensor unit 130 and a time (e.g., an end time) when the robot hand 10 stopped being detected by the second sensor unit 130. This may be done for all the robot hands 10. The first line J1 and the second line J2 may be spaced apart from each other in the first direction D1. In an exemplary embodiment of the inventive concept, a distance between the first and second lines J1 and J2 may be substantially the same as the second distance d2 described with reference to FIG. 1.

In an exemplary embodiment of the inventive concept, the robot hands 10 may be spaced apart from each other by the same vertical distance. In this case, there may be no difference between the first and second sensor units 120 and 130 in terms of an end time of detecting one of the robot hands 10 and a start time of detecting an adjacent robot hand 10 of the robot hands 10. For example, both the first and second sensor units 120 and 130, respectively, may detect, at the same time, a first robot hand 10, continue to detect the first robot hand 10, stop detecting the first robot hand 10 (e.g., the first robot hand 10 passed through the first and second sensing lines SL1 and SL2, and detect a second robot hand 10 adjacent to the first robot hand 10. In an exemplary embodiment of the inventive concept, the side surfaces S1, S2, S3, and S4 of each of the robot hands 10 may be disposed at substantially the same level (e.g., height, with respect to the supporting substrate 110) in the third direction D3. In this case, there may be no difference between the first and second sensor units 120 and 130 in terms of start and end times of detecting each of the robot hands 10.

In some cases, as shown in FIG. 5, vertical distances between the robot hands 10 may be not uniform in the third direction D3. For example, a first distance between a first pair of robot hands, from among the robot hands 10 may be smaller than a second distance between a second pair of robot hands, from among the robot hands 10. However, the robot hands 10 may be disposed to be parallel to each other; for example, the side surfaces S1, S2, S3, and S4 of each of the robot hands 10 may be positioned at the same level in the third direction D3. In an exemplary embodiment of the inventive concept, a distance in the third direction D3 between the fifth and sixth robot hands 15 and 16 may be smaller than a normal distance (e.g., a predetermined distance by which most of the robot hands 10 are spaced apart by or are intended to be spaced apart by). A distance in the third direction D3 between the sixth and seventh robot hands 16 and 17 may be greater than the normal distance. If the fourth and fifth robot hands 14 and 15 is spaced apart from each other by the normal distance, a time interval between an end time of detecting the fifth robot hand 15 and a start time of detecting the sixth robot hand 16 may be shorter than that between an end time of detecting the fourth robot hand 14 and a start time of detecting the fifth robot hand 15. Also, a time interval between an end time of detecting the sixth robot hand 16 and a start time of detecting the seventh robot hand 17 may be larger than that between an end time of detecting the fourth robot hand 14 and a start time of detecting the fifth robot hand 15.

Referring to FIGS. 1, 4, and 6, the second side surface S2 of the sixth robot hand 16 may be positioned at a lower level than the first side surface S1, in the third direction D3. For example, the sixth robot hand 16 may not be parallel to the supporting substrate 110 while the robot hands 11 to 15 and 17 may be substantially parallel to the supporting substrate 110. The supporting substrate 110 may be leveled (e.g., perpendicular to a plumb line). In this case, the presence of the sixth robot hand 16 may be detected at an earlier time point by the second sensor unit 130 than by the first sensor unit 120. Although not shown, in the case where the second side surface S2 is positioned at a higher level than the first side surface S1 in the third direction D3, the presence of the sixth robot hand 16 may be detected at a later time point by the second sensor unit 130 than by the first sensor unit 120.

Referring to FIGS. 1, 4, and 7, the third side surface S3 of the sixth robot hand 16 may be positioned at a lower level than the fourth side surface S4 of the sixth robot hand 16, in the third direction D3. For example, the sixth robot hand 16 may not be parallel to the supporting substrate 110 while the robot hands 11 to 15 and 17 may be substantially parallel to the supporting substrate 110. The supporting substrate 110 may be leveled (e.g., perpendicular to a plumb line). In this case, the presence of the sixth robot hand 16 may be detected for a longer time period by the first and second sensor units 120 and 130 than a detecting period of time for the robot hands 11 to 15 and 17 because the sixth robot hand 16 is not substantially parallel to the supporting substrate like the robot hands 11 to 15 and 17. For example, the sixth robot hand 16 is sloped, tilted, or forms an angle with respect to the supporting substrate 110. In the case where the sixth robot hand 16 is sloped, tilted, or forms an angle with respect to the supporting substrate 110, the presence of the sixth robot hand 16 may be detected for a longer time period by the first and second sensor units 120 and 130 than a period of time during which the robot hands 11 to 15 and 17 are detected due to the slope, tilt, or angle which the sixth robot hand 16 forms with respect to the supporting substrate 110. In other words, when the third side surface S3 of the sixth robot hand 16 is positioned at a higher level than the fourth side surface S4 of the sixth robot hand 16 with respect to the supporting substrate 110 in the third direction D3, the presence of the sixth robot hand 16 may be detected for a longer time period than the time period during which the robot hands 11 to 15 and 17 are detected.

To check vertical distances between, and levels of, robot hands, it is necessary to measure positions of two different points of a robot hand. According to an exemplary embodiment of the inventive concept, since two sensor units are provided, by moving the robot hands 10 in the third direction D3, the vertical distances between the robot hands 10 may be checked. In addition, whether the robot hands 10 are tilted, sloped, or form an angle with respect to the supporting substrate 110 may be determined using the two sensor units. In other words, the robot hands 10 may be inspected without necessity of moving them in the first direction D1. However, technical features and aspects of the inventive concept are not limited to those disclosed above.

Figure 8:
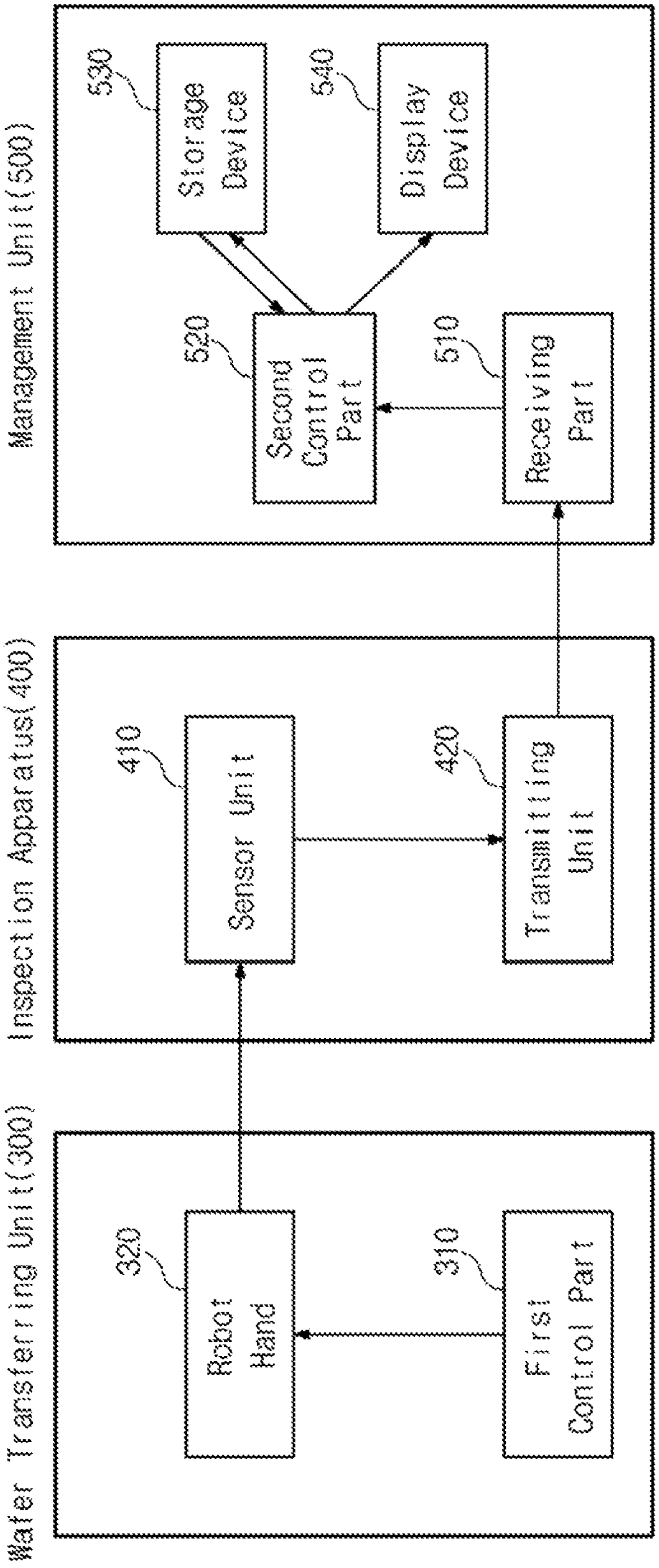
FIG. 8 is a block diagram illustrating a system for inspecting a wafer transferring robot including a robot hand inspection apparatus according to an exemplary embodiment of the inventive concept.

FIG. 8 is a block diagram illustrating a system for inspecting a wafer transferring robot including a robot hand inspection apparatus according to an exemplary embodiment of the inventive concept. For brevity, elements of the robot hand inspection apparatus previously described with reference to FIGS. 1 and 2 may be referred to using similar or identical reference numerals.

Referring to FIG. 8, a wafer transferring unit 300 may include a plurality of robot hands 320. The plurality of robot hands 320 may be referred to as the robot hands 320. The robot hands 320 may be connected to a body of the wafer transferring unit 300 or have a shape protruding from the body of the wafer transferring unit 300. The wafer transferring unit 300 may include a first control part 310 to control a vertical movement of each of the robot hands 320. When the robot hands 320 move under the control of the first control part 310, the position and movement of each of the robot hands 320 may be measured by a sensor unit 410. A thickness of each of the robot hands 320 and a vertical distance between two adjacent robot hands 320 or a plurality of consecutive robot hands 320 may be determined using the position and movement measurements obtained by the sensor unit 410.

An inspection apparatus 400 may include the sensor unit 410, which is configured to collect information on the robot hands 320 of the wafer transferring unit 300. For example, the sensor unit 410 of the inspection apparatus 400 may be configured to detect the presence or absence of each of the robot hands 320. The sensor unit 410 may be configured to have substantially the same features as the first and second sensor units 120 and 130 described with reference to the FIGS. 1 and 2. The inspection apparatus 400 may include a transmitting unit 420 configured to send sensing information measured by the sensor unit 410 to a management unit 500. The transmitting unit 420 may include a wired or wireless transmitting part.

The management unit 500 may be configured to receive and process the sensing information transmitted from the inspection apparatus 400. The management unit 500 may include a receiving part 510 receiving the sensing information transmitted from the transmitting unit 420 of the inspection apparatus 400. The receiving part 510 may include a wired or wireless receiving part. The management unit 500 may further include a second control part 520 configured to process the sensing information received through the receiving part 510. For example, the second control part 520 may be configured to determine the tilting and slope angles of each robot hand 320 and to determine vertical distances between the robot hands 320 using the sensing information transmitted from the transmitting unit 420 of the inspection apparatus 400 and a speed of the robot hands 320 in the third direction D3, as controlled by the first control part 310. In an exemplary embodiment of the inventive concept, the sensing information to be processed in the second control part 520 may contain information including whether any one of the robot hands 320 is present or absent on the sensing lines of FIG. 1 and a time when each of the robot hands 320 is sensed by each of the sensing lines of FIG. 1. For example, a distance in the third direction D3 between two or more robot hands 320 may be determined using the sensing information received by the first and second sensor units 120 and 130 (e.g., times when the two or more robot hands were detected by the first and second sensor units 120 and 130) and a speed of the two or more robot hands in the third direction D3. In addition, an angle of a first robot hand 320 may be determined using a first time in which the first sensor unit 120 senses a first portion of the first robot hand 320, a second time in which the second sensor unit 130 senses a second portion of the first robot hand 320, and a speed of the first robot hand 320 in the third direction D3. Each item of the sensing information may be given as a mean value. For example, the second control part 520 may be configured to calculate a mean value of five sensing results for each item (e.g., a mean vertical distance between five robot hands 320). The management unit 500 may further include a storage device 530 and a display device 540, which are respectively configured to store and output (e.g., display) data processed by the second control part 520.

To check vertical distances between, and levels of, robot hands, it is necessary to measure positions of two different points of a robot hand. According to an exemplary embodiment of the inventive concept, since two sensor units are provided, by moving the robot hands 10 in the third direction D3, the vertical distances between the robot hands 10 may be checked. In addition, whether the robot hands 10 are tilted, sloped, or form an angle with respect to the supporting substrate 110 may be determined using the two sensor units. In other words, the robot hands may be inspected without necessity of moving them in the first direction D1. However, technical features and aspects of the inventive concept are not limited to those disclosed above.

According to an exemplary embodiment of the inventive concept, an inspection apparatus may include two sensor units. Accordingly, vertical distances between, and levels of, the robot hands may be determined by moving the robot hands in a direction parallel to a supporting substrate. Furthermore, it is possible to inspect the robot hands, without necessity of moving the robot hands in a direction parallel to a supporting substrate.

While the present invention has been particularly shown and described with reference to exemplary embodiments thereof, it will be apparent to those of ordinary skill in the art that various changes in form and detail may be made therein without departing from the spirit and scope of the present invention as defined by the following claims.

What is claimed is:

1. An inspection apparatus, comprising:
a supporting substrate;
a first sensor unit provided on the supporting substrate, the first sensor unit comprising a first light-emitting device and a first light-receiving device which are spaced apart from each other and face each other; and
a second sensor unit provided on the supporting substrate, the second sensor unit comprising a second light-emitting device and a second light-receiving device which are spaced apart from each other and face each other,
wherein the first and second light-emitting devices and the first and second light-receiving devices are disposed at a same distance from a top surface of the supporting substrate, and
the first and second sensor units are configured to detect whether a plurality of robot hands moves in a first direction perpendicular to the top surface of the supporting substrate and to collect data corresponding to a detection of the plurality of robot hands, wherein the data corresponding to the detection of the robot hands is transmitted to a management unit, wherein the management unit is configured to obtain information on distances between each of the robot hands by using the data corresponding to the detection of the robot hands.

2. The inspection apparatus of claim 1, wherein the robot hand inspection apparatus is configured to allow a robot hand to pass through regions between the first light-emitting device and the first light-receiving device and between the second light-emitting device and the second light-receiving device.

3. The inspection apparatus of claim 1, further comprising supporting rods disposed on the supporting substrate,
wherein the first and second light-emitting devices and the first and second light-receiving devices are spaced apart from the supporting substrate and are respectively supported by the supporting rods.

4. The inspection apparatus of claim 1, wherein the first light-emitting device is disposed at a first height with respect to the supporting substrate in the first direction, and
the first height is greater than a thickness of a robot hand.

5. The inspection apparatus of claim 1, wherein the first and second sensor units are configured to detect two different points of a robot hand.

6. The inspection apparatus of claim 1, wherein the first sensor unit is configured to detect whether a robot hand passes through a first imaginary line connecting the first light-emitting device and the first light-receiving device, and
the second sensor unit is configured to detect whether the robot hand passes through a second imaginary line connecting the second light-emitting device and the second light-receiving device.

7. The inspection apparatus of claim 1, wherein the first and second sensor units, respectively, are configured to measure start and end times of detecting each of the robot hands, wherein the data corresponding to the detection of the plurality of robot hands includes data measured by the first and second sensor units.

8. The inspection apparatus of claim 7, wherein the first and second sensor units, respectively, are configured to detect each of the robot hands at substantially the same time and to stop detecting each of the robot hands at substantially the same time when the robot hands are substantially parallel to the supporting substrate.

9. The inspection apparatus of claim 7, further comprising a wireless transmitting part for transmitting data measured by the first and second sensor units to the management unit,
wherein the management unit is further configured to obtain information on inclination angles of each of the robot hands using the data measured by the first and second sensor units and to display the information on the distances between each of the robot hands and the inclination angles of the robot hands.

10. A system for inspecting a wafer transferring robot, comprising:
an inspection apparatus including:
a supporting substrate;
a first light-emitting device disposed at a first distance from the supporting substrate in a first direction and configured to emit a first light in a second direction, wherein the first and second directions cross each other;
a second light-emitting device disposed at the first distance from the supporting substrate in the first direction and configured to emit a second light in the second direction, wherein the second light-emitting device is spaced apart from the first light-emitting device in a third direction that is orthogonal the first and second directions;
a first light-receiving device configured to detect the first light;
a second light-receiving device configured to detect the second light; and
a transmitting unit;
a wafer transferring unit including:
a first robot hand and a second robot hand spaced apart from the first robot hand in the first direction, wherein the first and second robot hands are disposed on the substrate; and
a first control part configured to move the first and second robot hands in the first direction at a first speed, wherein the first and second robot hands are detected by the first and second light-receiving devices, respectively, when blocking the first and second lights from being detected by the first and second light-receiving devices,
wherein the transmitting unit is configured to transmit times when the first and second robot hands were detected by the first and second light-receiving devices to a receiving part of a management unit; and
the management unit including:
the receiving part configured to receive the transmitted times when the first and second robot hands were detected by the first and second light-receiving devices; and
a second control part configured to determine a first angle of the first robot hand with respect to the substrate using the first speed and the received times when the first and second robot hands were detected by the first and second light-receiving devices.

11. The system of claim 10, wherein the second control part is further configured to determine a first distance between the first and second robot hands in the first direction using the first speed and the received times when the first and second robot hands were detected by the first and second light-receiving devices.

12. The system of claim 11, wherein the received times when the first and second robot hands were detected by the first and second light-receiving devices include a first time when the first robot hand was detected by the first light-receiving device and a second time when the second robot hand was detected by the second light-receiving device.

13. The system of claim 10, wherein the first angle of the first robot hand is determined using a first time in which the first light-receiving device detects a first portion of the first robot hand, a second time in which the second light-receiving device detects a second portion of the first robot hand, and the first speed.

14. The system of claim 11, wherein the management unit further includes a storage device configured to store the first angle and the first distance, and a display device configured to display the first angle and the first distance.

* * * * *